(12) United States Patent
Happ et al.

(10) Patent No.: US 7,679,980 B2
(45) Date of Patent: Mar. 16, 2010

(54) RESISTIVE MEMORY INCLUDING SELECTIVE REFRESH OPERATION

(75) Inventors: Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 509 days.

(21) Appl. No.: 11/602,719

(22) Filed: Nov. 21, 2006

(65) Prior Publication Data

US 2008/0117704 A1    May 22, 2008

(51) Int. Cl.
*G11C 7/00* (2006.01)

(52) U.S. Cl. .................. 365/222; 365/148; 365/163

(58) Field of Classification Search ............ 365/46, 365/94, 100, 113, 148, 163, 222; 257/2–5, 257/296, E31.047, E27.006; 438/29, 95, 438/96, 166, 365, 482, 486, 597
See application file for complete search history.

(56) References Cited

U.S. PATENT DOCUMENTS 6,768,665 B2 *   7/2004   Parkinson et al. ........... 365/113
2006/0056251 A1 *   3/2006   Parkinson ................... 365/202

FOREIGN PATENT DOCUMENTS

EP        1420412        11/2002

* cited by examiner

*Primary Examiner*—Richard Elms
*Assistant Examiner*—Harry W Byrne
(74) *Attorney, Agent, or Firm*—Dicke, Billig & Czaja, PLLC (57) ABSTRACT

A memory includes an array of phase change memory cells and a first circuit. The first circuit is for refreshing only memory cells within the array of phase change memory cells that are programmed to non-crystalline states in response to a request for a refresh operation.

18 Claims, 8 Drawing Sheets

RESISTIVE MEMORY INCLUDING SELECTIVE REFRESH OPERATION

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy. For simplicity, the description of multilevel operation in this disclosure is substantially focused on four different resistance levels or states and two bits of data per cell. This is for illustrative purposes only, however, and not intended to limit the scope of the invention. In principle it is possible to store three or more states.

The data retention performance of a phase change memory depends strongly upon the temperature history of the memory. Typically, for nonvolatile memory, data retention is guaranteed for more than ten years at operating temperatures up to 85° C. Data retention is mainly a material property and depends on the crystallization temperature of the phase change material. For example, for $Ge_2Sb_2Te_5$, the data retention performance is about ten years at operating temperatures up to 105° C. to 110° C. For many applications, however, this temperature specification is not sufficient. For example, in automotive applications this temperature specification may be exceeded. Also, a memory device is not usually operated at a constant ambient temperature, but rather experiences significant changes in the ambient temperature. For example, a memory device for an engine controller of a vehicle experiences extremes in temperatures based on whether the engine is running. In this case, data retention of the memory device is not so strongly impacted by momentary temperatures (within certain limits) or an average temperature, but rather by the temperature budget accumulated by the memory device. In addition, data retention is more critical in multi-bit phase change memory cells than in single bit phase change C memory cells.

For these and other reasons, there is a need for the present invention.

SUMMARY

One embodiment provides a memory. The memory includes an array of phase change memory cells and a first circuit. The first circuit is for refreshing only memory cells within the array of phase change memory cells that are programmed to non-crystalline states in response to a request for a refresh operation.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
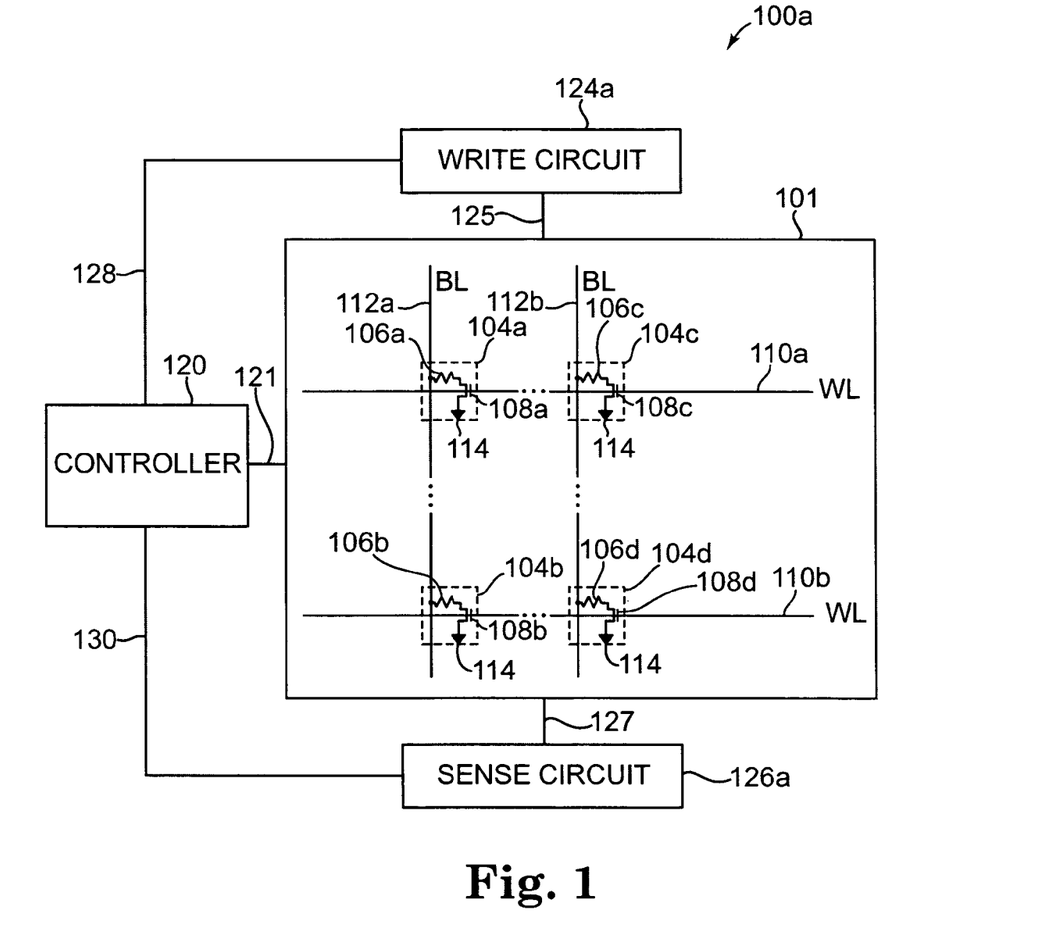
FIG. 1 is a diagram illustrating one embodiment of a memory device.

FIG. 1 is a diagram illustrating one embodiment of a memory device 100a. Memory device 100a includes write circuit 124a, controller 120, memory array 101, and sense circuit 126a. Memory array 101 includes a plurality of phase change memory cells 104a-104d (collectively referred to as phase change memory cells 104), a plurality of bit lines (BLs) 112a-112b (collectively referred to as bit lines 112), and a plurality of word lines (WLs) 110a-110b (collectively referred to as word lines 110).

Phase change memory cells 104 are periodically refreshed to maintain their values. In response to a request for a refresh operation, the resistance state of each phase change memory cell 104 is read. If the phase change memory cell 104 is in a non-crystalline state (i.e., an amorphous state or a partially amorphous and partially crystalline state), that phase change memory cell 104 is reset to its programmed resistance state. Phase change memory cells 104 in the fully crystalline state are not refreshed since temperature changes can only irreversibly further decrease the programmed resistance in the fully crystalline state. A further decrease in the programmed resistance is not detrimental; rather it enhances the sensing window.

A reset operation uses less energy and less time than a set operation. For example, in one embodiment, a reset operation of one memory cell 104 uses 600 µA at 0.75V=450 GW for 30 ns. A set operation of one memory cell 104 uses 50% of the power used for a reset operation for 150 ns. Therefore, the energy used to set one memory cell 104 equals 34 pJ while the energy used to reset one memory cell 104 equals 14 pJ. By only refreshing memory cells 104 that are not in the fully crystalline state, less energy is consumed and the refresh operation is completed in less time than if all the memory cells 104 were refreshed.

As used herein, the term "electrically coupled" is not meant to mean that the elements must be directly coupled together and intervening elements may be provided between the "electrically coupled" elements.

Memory array 101 is electrically coupled to write circuit 124a through signal path 125, to controller 120 through signal path 121, and to sense circuit 126a through signal path 127. Controller 120 is electrically coupled to write circuit 124a through signal path 128 and to sense circuit 126a through signal path 130. Each phase change memory cell 104 is electrically coupled to a word line 110, a bit line 112, and a common or ground 114. Phase change memory cell 104a is electrically coupled to bit line 112a, word line 110a, and common or ground 114, and phase change memory cell 104b is electrically coupled to bit line 112a, word line 110b, and common or ground 114. Phase change memory cell 104c is electrically coupled to bit line 112b, word line 110a, and common or ground 114, and phase change memory cell 104d is electrically coupled to bit line 112b, word line 110b, and common or ground 114.

Each phase change memory cell 104 includes a phase change element 106 and a transistor 108. While transistor 108 is a field-effect transistor (FET) in the illustrated embodiment, in other embodiments, transistor 108 can be another suitable device such as a bipolar transistor or a 3D transistor structure. In other embodiments, a diode-like structure may be used in place of transistor 108. Phase change memory cell 104a includes phase change element 106a and transistor 108a. One side of phase change element 106a is electrically coupled to bit line 112a, and the other side of phase change element 106a is electrically coupled to one side of the source-drain path of transistor 108a. The other side of the source-drain path of transistor 108a is electrically coupled to common or ground 114. The gate of transistor 108a is electrically coupled to word line 110a.

Phase change memory cell 104b includes phase change element 106b and transistor 108b. One side of phase change element 106b is electrically coupled to bit line 112a, and the other side of phase change element 106b is electrically coupled to one side of the source-drain path of transistor 108b. The other side of the source-drain path of transistor 108b is electrically coupled to common or ground 114. The gate of transistor 108b is electrically coupled to word line 110b.

Phase change memory cell 104c includes phase change element 106c and transistor 108c. One side of phase change element 106c is electrically coupled to bit line 112b and the other side of phase change element 106c is electrically coupled to one side of the source-drain path of transistor 108c. The other side of the source-drain path of transistor 108c is electrically coupled to common or ground 114. The gate of transistor 108c is electrically coupled to word line 110a.

Phase change memory cell 104d includes phase change element 106d and transistor 108d. One side of phase change element 106d is electrically coupled to bit line 112b and the other side of phase change element 106d is electrically coupled to one side of the source-drain path of transistor 108d. The other side of the source-drain path of transistor 108d is electrically coupled to common or ground 114. The gate of transistor 108d is electrically coupled to word line 110b.

In another embodiment, each phase change element 106 is electrically coupled to a common or ground 114 and each transistor 108 is electrically coupled to a bit line 112. For example, for phase change memory cell 104a, one side of phase change element 106a is electrically coupled to common or ground 114. The other side of phase change element 106a is electrically coupled to one side of the source-drain path of transistor 108a. The other side of the source-drain path of transistor 108a is electrically coupled to bit line 112a.

Each phase change element 106 comprises a phase change material that may be made up of a variety of materials in accordance with the present invention. Generally, chalcogenide alloys that contain one or more elements from group VI of the periodic table are useful as such materials. In one embodiment, the phase change material of phase change element 106 is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element 106 may be changed from an amorphous state to a crystalline state or from a crystalline state to an amorphous state under the influence of temperature change. The amount of crystalline material coexisting with amorphous material in the phase change material of one of the phase change elements 106a-106d thereby defines two or more states for storing data within memory device 100a. In the amorphous state, a phase change material exhibits significantly higher resistivity than in the crystalline state. Therefore, the two or more states of phase change elements 106a-106d differ in their electrical resistivity. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory circuit 100a. Controller 120 controls read and write operations of memory circuit 100a including the application of control and data signals to memory array 101 through write circuit 124a and sense circuit 126a. In one embodiment, write circuit 124a provides voltage pulses through signal path 125 and bit lines 112 to memory cells 104 to program the memory cells. In other embodiments, write circuit 124a provides current pulses through signal path 125 and bit lines 112 to memory cells 104 to program the memory cells.

Sense circuit 126a reads each of the two or more states of memory cells 104 through bit lines 112 and signal path 127. In one embodiment, to read the resistance of one of the memory cells 104, sense circuit 126a provides current that flows through one of the memory cells 104. Sense circuit 126a then reads the voltage across that one of the memory cells 104. In one embodiment, sense circuit 126a provides voltage across one of the memory cells 104 and reads the current that flows through that one of the memory cells 104. In one embodiment, write circuit 124a provides voltage across one of the memory cells 104 and sense circuit 126a reads the current that flows through that one of the memory cells 104. In one embodiment, write circuit 124a provides current that flows through one of the memory cells 104 and sense circuit 126a reads the voltage across that one of the memory cells 104.

During a set operation of phase change memory cell 104a, one or more set current or voltage pulses are selectively enabled by write circuit 124a and sent through bit line 112a to phase change element 106a thereby heating phase change element 106a above its crystallization temperature (but usually below its melting temperature) with word line 110a selected to activate transistor 108a. In this way, phase change element 106a reaches its crystalline state or a partially crystalline and partially amorphous state during this set operation. During a reset operation of phase change memory cell 104a, a reset current or voltage pulse is selectively enabled by write circuit 124a and sent through bit line 112a to phase change element 106a. The reset current or voltage quickly heats phase change element 106a above its melting temperature.

After the current or voltage pulse is turned off, phase change element 106a quickly quench cools into the amorphous state or a partially amorphous and partially crystalline state. Phase change memory cells 104b-104d and other phase change memory cells 104 in memory array 100a are set and reset similarly to phase change memory cell 104a using a similar current or voltage pulse.

Figure 2:
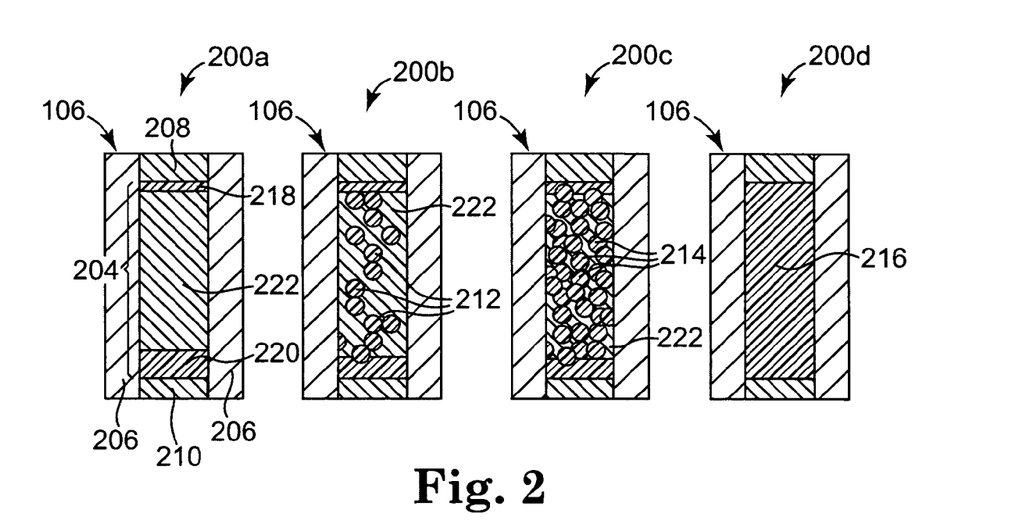
FIG. 2 is a diagram illustrating one embodiment of a multi-bit or multilevel phase change element in four different states.

FIG. 2 is a diagram illustrating one embodiment of a multi-bit or multilevel phase change element 106 in four different states at 200a, 200b, 200c, and 200d. Phase change element 106 includes a phase change material 204 that is laterally surrounded by insulation material 206. Phase change element 106 can have any suitable geometry including phase change material 204 in any suitable geometry and insulation material 206 in any suitable geometry.

Phase change material 204 is electrically coupled at one end to a first electrode 208 and at the other end to a second electrode 210. Pulses are provided to phase change element 106 via first electrode 208 and second electrode 210. The current path through phase change material 204 is from one of the first electrode 208 and second electrode 210 to the other one of the first electrode 208 and second electrode 210. Phase change element 106 provides a storage location for storing bits of data.

Insulation material 206 can be any suitable insulator, such as $SiO_2$, SiOx, SiN, fluorinated silica glass (FSG), or borophosphorous silicate glass (BPSG). First electrode 208 and second electrode 210 can be any suitable electrode material, such as TiN, TiSiN, TiAlN, TaN, TaSiN, TaAlN, W, WN, Al, or Cu.

Phase change material 204 is programmed into one of four resistance states to store two bits of data. A write circuit, such as write circuit 124a, is electrically coupled to first electrode 208 to provide pulses to phase change material 204. The pulses reset phase change material 204 or program one of the other three resistance states into phase change material 204. At 200b, a small fraction 212 of phase change material 204 has been programmed through phase change into the crystalline state to change the resistance through phase change element 106. At 200c, a medium sized fraction 214 of phase change material 204 has been programmed through phase change into the crystalline state to change the resistance through phase change element 106. At 200d, a large fraction 216, which is substantially all of phase change material 204, has been programmed through phase change into the crystalline state to change the resistance through phase change element 106.

The size of the programmed fraction is related to the resistance through phase change material 204 and phase change element 106. The three different phase change fractions at 200b-200d plus the initial state at 200a provide four resistance states in phase change material 204, and phase change element 106 provides a storage location for storing two bits of data. In one embodiment, the state of phase change element 106 at 200a is a "00", the state of phase change element 106 at 200b is a "01", the state of phase change element 106 at 200c is a "10", and the state of phase change element 106 at 200d is a "11". In another embodiment, the state of phase change element 106 at 200a is a "11", the state of phase change element 106 at 200b is a "10", the state of phase change element 106 at 200c is a "01", and the state of phase change element 106 at 200d is a "00".

At 200a, phase change material 204 is reset to a substantially amorphous state. During a reset operation of phase change element 106, a reset current pulse is provided via write circuit 124a through first electrode 208 and phase change material 204. The reset current pulse heats phase change material 204 above its melting temperature and phase change material 204 is quickly cooled to achieve the substantially amorphous state at 200a. After a reset operation, phase change material 204 includes crystalline state phase change material at 218 and 220, and amorphous state phase change material at 222. The substantially amorphous state at 200a, referred to herein as one of the non-crystalline states, is the highest resistance state of phase change element 106.

To program phase change material 204 into one of the other three states 200b-200d, a set current pulse is provided via write circuit 124a through first electrode 208 and phase change material 204. At 200b, write circuit 124a provides a set current pulse to program the small volume fraction 212 into a crystalline state. The crystalline state is less resistive than the amorphous state and phase change element 106 at 200b has a lower resistance than phase change element 106 in the substantially amorphous state at 200a. The partially crystalline and partially amorphous state at 200b, referred to herein as one of the non-crystalline states, is the second highest resistance state of phase change element 106.

At 200c, write circuit 124a provides a set current pulse to program the medium volume fraction 214 into a crystalline state. Since the crystalline fraction 214 is larger than the crystalline fraction 212 and the crystalline state is less resistive than the amorphous state, phase change element 106 at 200c has a lower resistance than phase change element 106 at 200b and phase change element 106 in the amorphous state at 200a. The partially crystalline and partially amorphous state at 200c, referred to herein as one of the non-crystalline states, is the second lowest resistance state of phase change element 106.

At 200d, write circuit 124a provides a set current pulse to program substantially all of the phase change material 216 into the crystalline state. Since the crystalline state is less resistive than the amorphous state, phase change element 106 at 200d has a lower resistance than phase change element 106 at 200c, phase change element 106 at 200b, and phase change element 106 in the amorphous state at 200a. The substantially crystalline state at 200d is the lowest resistance state of phase change element 106. In other embodiments, phase change element 106 can be programmed into any suitable number of resistance values or states. In other embodiments, phase change element 106 can be set to a substantially crystalline state and reset pulses can be used to program phase change element 106 to the desired resistance value or state.

Figure 3:
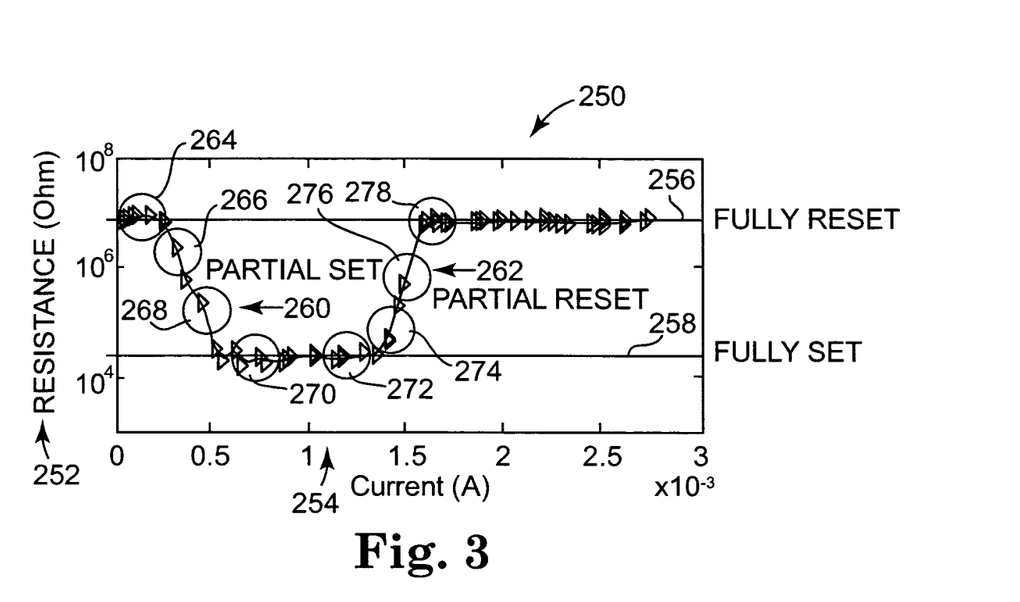
FIG. 3 is a graph illustrating one embodiment of setting the resistance states of a phase change memory cell.

FIG. 3 is a graph 250 illustrating one embodiment of setting the resistance states of a phase change element 106. Graph 250 includes the current in Amps (A) applied to the phase change element on x-axis 254 versus the resistance in Ohms of the phase change element on y-axis 252 after applying the specified current. Starting from a fully reset phase change element as indicated at 256, a current between approximately 0 A and $0.3 \times 10^{-3}$ A does not change the resistance state of the phase change element from the fully reset state. A current between approximately $0.3 \times 10^{-3}$ A and $0.5 \times 10^{-3}$ A changes the resistance state of the phase change element to a partially set state as indicated at 260. A current between approximately $0.5 \times 10^{-3}$ A and $1.4 \times 10^{-3}$ A changes the resistance state of the phase change element to a fully set state as indicated at 258. A current between approximately $1.4 \times 10^{-3}$ A and $1.6 \times 10^{-3}$ A changes the resistance state of the phase change element to a partially reset state as indicated at 262. A current greater than approximately $1.6 \times 10^{-3}$ A changes the resistance state of the phase change element back to the fully reset state as indicated at 256. The specific current ranges for obtaining the partially set, fully set, partially reset, and fully reset states vary based on the phase change material used, the memory cell concept used, and the memory cell dimensions used.

Starting from the fully reset state as indicated at 256, a phase change element 106 can be programmed to one of four resistance states by controlling the current. If no current is applied, the phase change element remains in the fully reset state. If a small current pulse is applied, the phase change element is programmed to a first state as indicated at 264. This state is illustrated at 200a in FIG. 2. In one embodiment, this state is a "11" state. If a higher current pulse is applied, the phase change element is programmed to a second state as indicated at 266. This state is illustrated at 200b in FIG. 2. In one embodiment, this state is a "10" state. If higher current is applied beyond the second state, the phase change element is programmed to a third state as indicated at 268. This state is illustrated at 200c in FIG. 2. In one embodiment, this state is a "01" state. If higher current is applied beyond the third state, the phase change element is programmed to the fully set state as indicated at 270. This state is illustrated at 200d in FIG. 2. In one embodiment, this state is a "00" state.

Starting from the fully set state as indicated at 258, a phase change element can also be programmed to one of four resistance states by controlling the current. For example, if a first current is applied, the phase change element is programmed to a first state as indicated at 272. In one embodiment, this state is a "00" state. If higher current is applied beyond the first state, the phase change element is programmed to a second state as indicated at 274. In one embodiment, this state is a "01" state. If higher current is applied beyond the second state, the phase change element is programmed to a third state as indicated at 276. In one embodiment, this state is a "10" state. If higher current is applied beyond the third state, the phase change element is programmed to the fully reset state as indicated at 278. In one embodiment, this state is a "11" state.

Figure 4:
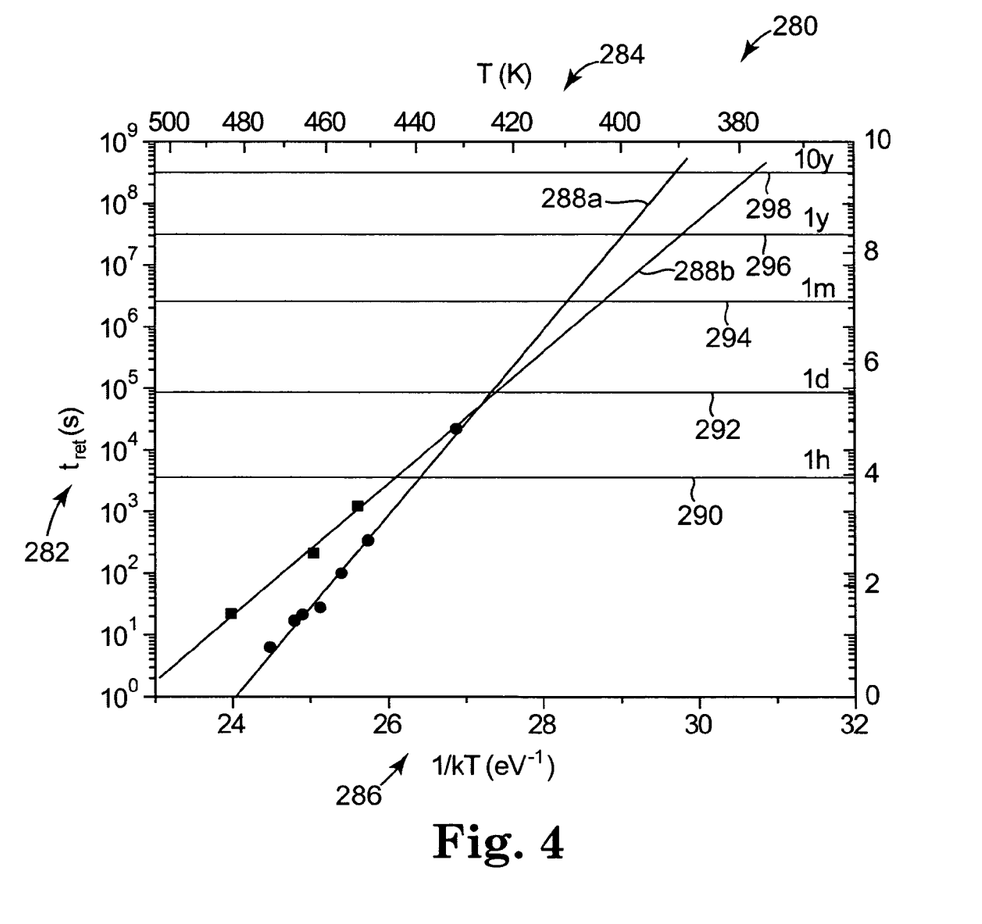
FIG. 4 is a chart illustrating one embodiment of retention time versus temperature for two different experiments.

FIG. 4 is a chart 280 illustrating one embodiment of retention time versus temperature for two different experiments. Chart 280 includes temperature (T) in Kelvin (K) on x-axis 284 and in 1/kT ($eV^{-1}$) on x-axis 286 and retention time ($t_{ret}$) in seconds (s) on Y-axis 282. Line 288a illustrates the retention time versus temperature for single bit memory cells in a first experiment and line 288b illustrates the retention time versus temperature for single bit memory cells in a second experiment. The data retention time is critical for single bit phase change memory cells and the problem is enhanced for multi-bit phase change memory cells.

As illustrated in chart 280, the specification of 105° C. for 10 year data retention in memory device 100a is indicated at 298. Memory device 100a can be operated at a temperature of approximately 120° C. (393 K) if phase change elements 106 of memory device 100a are refreshed once a year as indicated at 296. Memory device 100a can be operated at a temperature of approximately 130° C. (403 K) if phase change elements 106 of memory device 100a are refreshed once a month as indicated at 294. Memory device 100a can be operated at a temperature of approximately 150° C. (423 K) if phase change elements 106 of memory device 100a are refreshed once a day as indicated at 292. Memory device 100a can be operated at a temperature of approximately 170° C. (443 K) if phase change elements 106 of memory device 100a are refreshed once an hour as indicated at 290. As the refresh period is shortened, the temperature memory device 100a can withstand increases.

Figure 5:
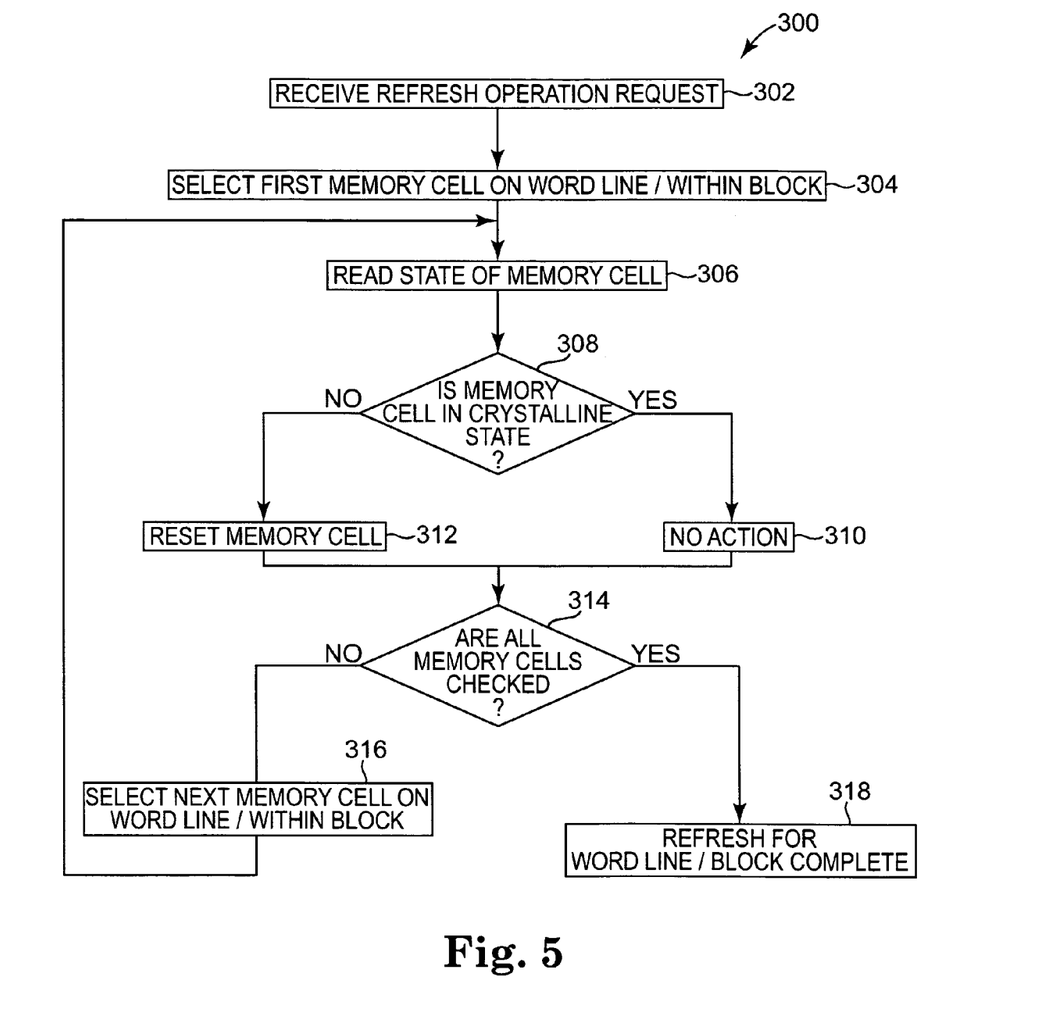
FIG. 5 is a flow diagram illustrating one embodiment of a method for refreshing phase change memory cells.

FIG. 5 is a flow diagram illustrating one embodiment of a method 300 for refreshing phase change memory cells 104, such as phase change memory cells 104 in memory device 100a. At 302, controller 120 receives or issues a request for a refresh operation. At 304, a first memory cell 104 on a word line 110 or within a block of memory cells 104 is selected by activating a word line to turn on the transistor 108 of the selected memory cell 104. At 306, sense circuit 126a reads the resistance state of the selected memory cell 104. At 308, sense circuit 126a and/or controller 120 determine whether the selected memory cell 104 is in the crystalline state or a non-crystalline state. If the selected memory cell 104 is in the crystalline state, then at 310 no further action is taken with respect to the selected memory cell 104. If the selected memory cell 104 is in a non-crystalline state, then at 312 write circuit 124a refreshes the selected memory cell by resetting the selected memory cell 104 to its programmed resistance state.

At 314, controller 120 determines whether all memory cells 104 on the word line 110 or within the block of memory cells 104 have been checked for potential refresh. If all the memory cells 104 on the word line 110 or within the block of memory cells 104 have not been checked for potential refresh, the next memory cell 104 on the word line 110 or within the block of memory cells 104 is selected. With the next memory cell 104 selected, control returns to block 306 where sense circuit 126a reads the resistance state of the selected memory cell 104 and the process repeats. If all the memory cells 104 on the word line 110 or within the block of memory cells 104 have been checked for potential refresh, then at 318 the refresh operation for the current word line 110 or the current block of memory cells 104 is complete. Blocks 304-318 of method 300 are then repeated to check the next word line 110 or the next block of memory cells 104 until every memory cell 104 within memory array 101 has been checked for potential refresh.

Figure 6:
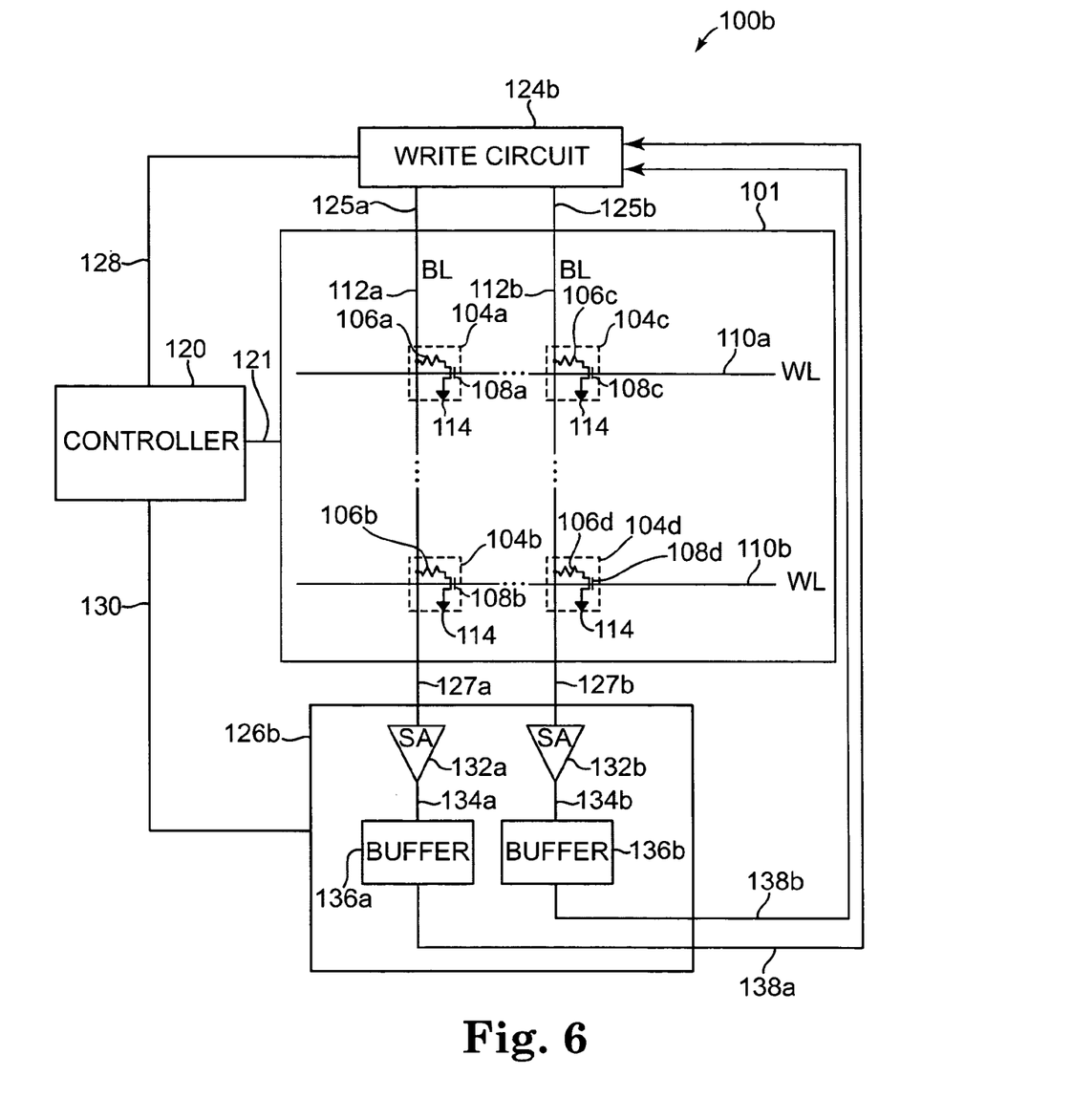
FIG. 6 is a diagram illustrating another embodiment of a memory device.

FIG. 6 is a diagram illustrating another embodiment of a memory device 100b. Memory device 100b is similar to memory device 100a previously described and illustrated with reference to FIG. 1, except that in memory device 100b write circuit 124a is replaced with write circuit 124b and sense circuit 126a is replaced with sense circuit 126b. Sense circuit 126b includes a plurality of sense amplifiers (SA) 132a-132b (collectively referred to as sense amplifiers 132) and a plurality of buffers 136a-136b (collectively referred to as buffers 136). Memory device 100b enables a parallel refresh operation for all memory cells on a word line 110.

Write circuit 124b is electrically coupled to bit lines 112 through signal paths 125. Write circuit 124b is electrically coupled to bit line 112a through signal path 125a, and write circuit 124b is electrically coupled to bit lint 112b through signal path 125b. The inputs of sense amplifiers 132 are electrically coupled to bit lines 112 through signal paths 127. The input of sense amplifier 132a is electrically coupled to bit line 112a through signal path 127a, and the input of sense amplifier 132b is electrically coupled to bit line 112b through signal path 127b.

The outputs of sense amplifiers 132 are electrically coupled to the inputs of buffers 136 through signal paths 134. The output of sense amplifier 132a is electrically coupled to the input of buffer 136a through signal path 134a, and the output of sense amplifier 132b is electrically coupled to the input of buffer 136b through signal path 134b. The outputs of buffers 136 are electrically coupled to inputs of write circuit 124b through signal paths 138. The output of buffer 136a is electrically coupled to an input of write circuit 124b through signal path 138a, and the output of buffer 136b is electrically coupled to an input of write circuit 124b through signal path 138b.

Sense amplifier 132a reads each of the two or more states of a selected memory cell 104a-104b through bit line 112a and signal path 127a. During a refresh operation, buffer 136a temporarily stores the state of the selected memory cell 104a-104b passed from sense amplifier 132a. In response to the state of the selected memory cell 104a-104b being a non-crystalline state, buffer 136a passes a write enable signal to write circuit 124b. In response to the write enable signal, write circuit 124b reprograms the selected memory cell 104a-104b through signal path 125a and bit line 112a to its programmed resistance state.

Sense amplifier 132b reads each of the two or more states of a selected memory cell 104c-104d through bit line 112b and signal path 127b. During a refresh operation, buffer 136b temporarily stores the state of the selected memory cell 104c-104d passed from sense amplifier 132b. In response to the state of the selected memory cell 104c-104d being a non-crystalline state, buffer 136b passes a write enable signal to write circuit 124b. In response to the write enable signal, write circuit 124b reprograms the selected memory cell 104c-104d through signal path 125b and bit line 112b to its programmed resistance state.

Figure 7:
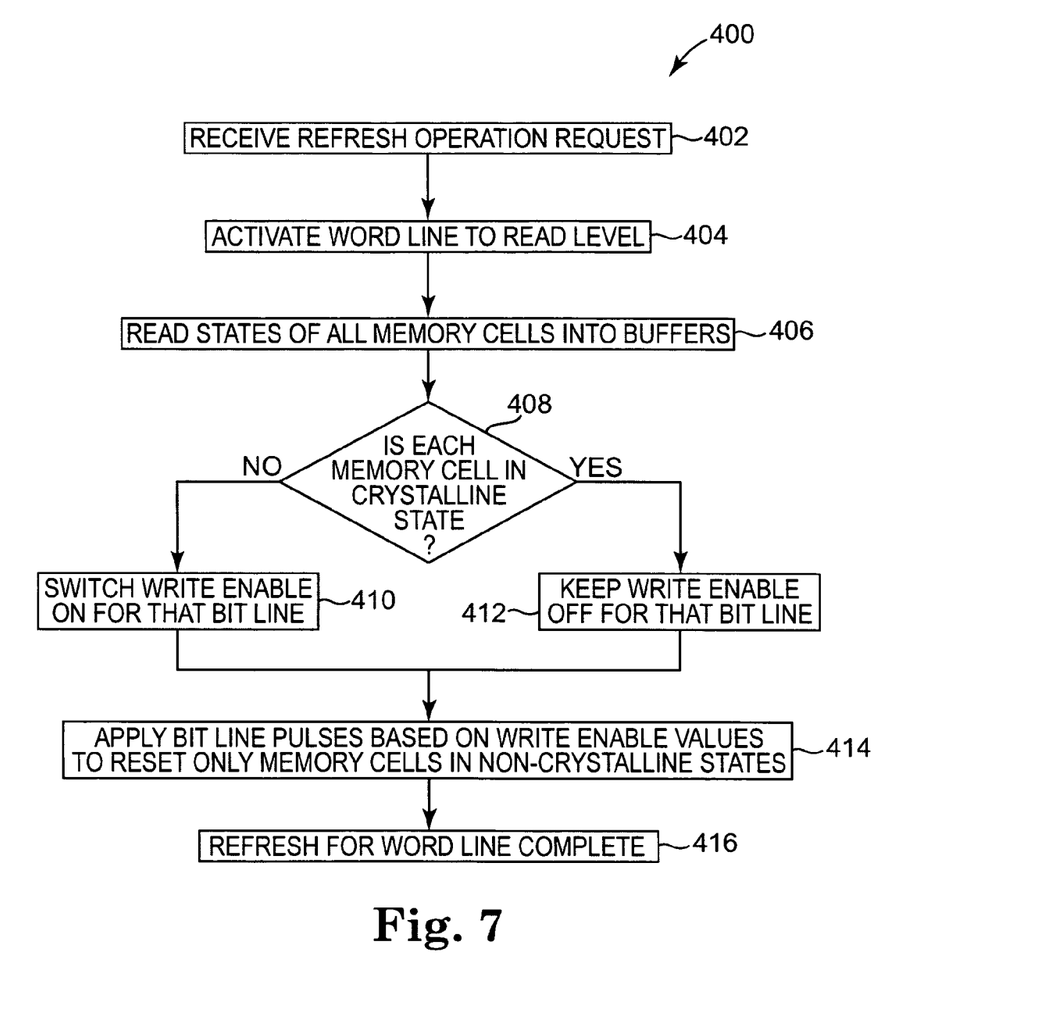
FIG. 7 is a flow diagram illustrating another embodiment of a method for refreshing phase change memory cells.

FIG. 7 is a flow diagram illustrating another embodiment of a method 400 for refreshing phase change memory cells 104, such as phase change memory cells 104 in memory device 100b. At 402, controller 120 receives or issues a request for a refresh operation. At 404, a word line 110 is activated to read the resistance states of memory cells 104 on the word line 110. At 406, sense amplifiers 132 read the states of all the memory cells 104 on the word line 110 and pass the states to buffers 136.

At 408, if the state stored in a buffer 136 is a non-crystalline state, then at 410 that buffer 136 activates the write enable signal for that bit line 112. If the state stored in a buffer 136 is the crystalline state, then at 412 that buffer 136 keeps the write enable signal for that bit line 112 deactivated. At 414, write circuit 124b applies bit line pulses based on the write enable signals to reset only memory cells 104 that are in a non-crystalline state. In one embodiment, the bit line pulses are provided in subgroups such as two, three, four, or another suitable number of bit lines 112 at a time. At 416, the refresh operation for the current word line is complete. Blocks 404-416 of method 400 are repeated to check the resistance states of memory cells 104 on the next word line 110 until every memory cell 104 within memory array 101 has been checked for potential refresh.

Figure 8:
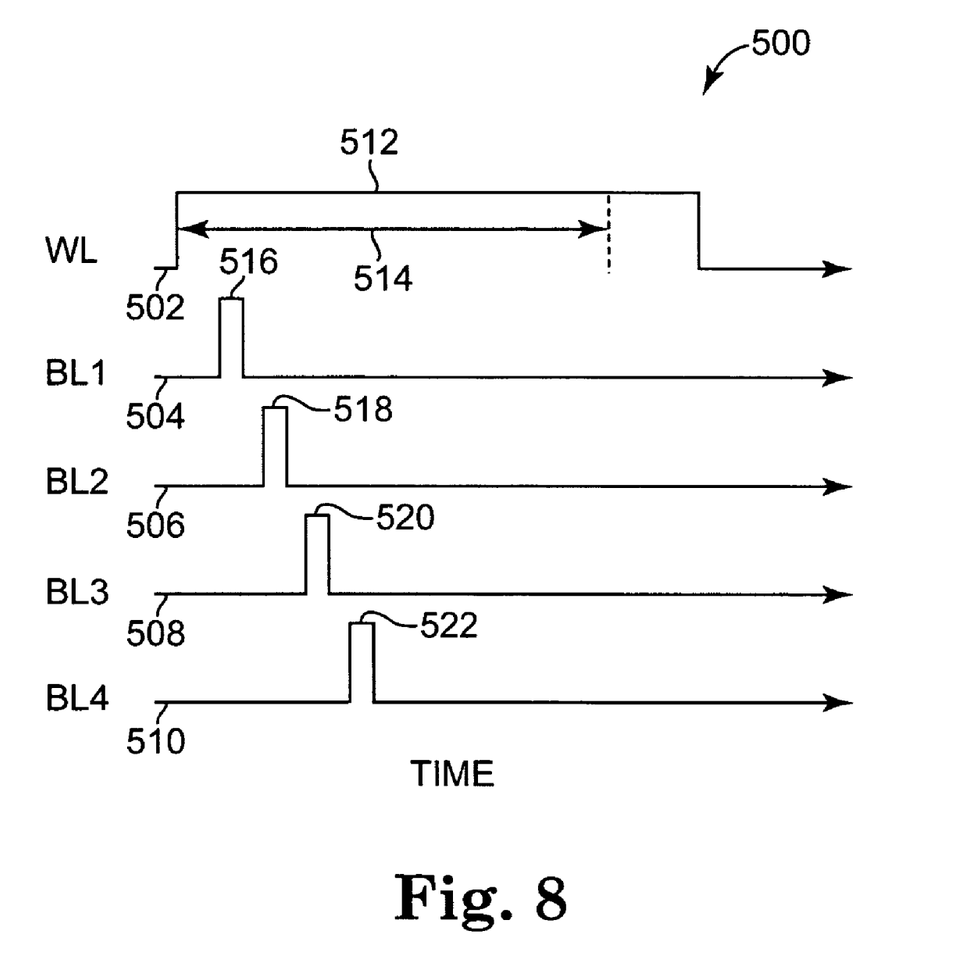
FIG. 8 is a timing diagram illustrating one embodiment of resetting multiple phase change memory cells in sequence.

FIG. 8 is a timing diagram 500 illustrating one embodiment of resetting multiple phase change memory cells 104 in sequence during a refresh operation. Timing diagram 500 includes a word line (WL) signal 502 on a word line 110, a first bit line (BL1) signal 504 on a first bit line 112, a second bit line (BL2) signal 506 on a second bit line 112, a third bit line (BL3) signal 508 on a third bit line 112, and a fourth bit line (BL4) signal 510 on a fourth bit line 112.

For a typical set or reset operation of a memory cell 104, word line signal 502 is activated as indicated at 512. A typical set operation time of a memory cell 104, which limits the write cycle time of a memory cell 104, is indicated at 514. Reset pulses 516, 518, 520, 522, and other reset pulses applied to other bit lines 112 are time shifted from each other within the typical write cycle time. By shifting the reset pulses such that they do not overlap, an increase in current consumption during a refresh operation is avoided. In addition, by applying multiple reset pulses consecutively during the typical write cycle time instead of just one reset pulse, time is saved during the refresh operation.

Embodiments of the present invention provide a phase change memory including a refresh operation. The refresh operation only refreshes memory cells that are in a non-crystalline state. By not refreshing memory cells in the crystalline state, which does not exhibit data retention problems, both time and energy are saved during the refresh operation.

While the specific embodiments described herein substantially focused on using phase change memory elements, the present invention can be applied to any suitable type of resistive memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   an array of phase change memory cells; and
   a first circuit for refreshing only memory cells within the array of phase change memory cells that are programmed to non-crystalline states in response to a request for a refresh operation.

2. The memory of claim 1, further comprising:
   a second circuit for reading each memory cell within the array of phase change memory cells during a refresh operation to determine whether each memory cell is programmed to a non-crystalline state.

3. The memory of claim 1, wherein the first circuit refreshes at least two memory cells within the array of phase change memory cells by consecutively resetting the at least two memory cells within a set operation time.

4. The memory of claim 1, wherein the first circuit refreshes the memory cells by:
   activating a word line to read a state of each memory cell on the word line;
   reading the state of each memory cell on the word line and temporarily storing the state of each memory cell;
   providing a write enable signal in response to each temporarily stored state which includes a non-crystalline state; and
   refreshing a memory cell in response to each write enable signal.

5. The memory of claim 1, wherein the array of phase change memory cells comprises an array of single bit phase change memory cells.

6. The memory of claim 1, wherein the array of phase change memory cells comprises an array of multi-bit phase change memory cells.

7. A memory comprising:
   an array of resistive memory cells;
   a sense circuit configured for sensing a state of each memory cell in the array of resistive memory cells;
   a write circuit configured for programming each memory cell in the array of resistive memory cells; and
   a controller configured for controlling a refresh operation in which the sense circuit senses the state of each memory cell and the write circuit only refreshes the state of each memory cell sensed to be in a resistance state greater than a lowest resistance state.

8. The memory of claim 7, wherein the sense circuit comprises buffers for temporarily storing the sensed state of each memory cell during a refresh operation, the buffers providing signals to the write circuit indicating which memory cells are in a resistance state greater than the lowest resistance state.

9. The memory of claim 7, wherein the array of resistive memory cells comprises word lines and the refresh operation refreshes all memory cells on a word line in parallel.

10. The memory of claim 7, wherein the write circuit refreshes at least two memory cells by consecutively resetting the at least two memory cells within a set operation time.

11. The memory of claim 7, wherein the array of resistive memory cells comprises an array of single bit resistive memory cells.

12. The memory of claim 7, wherein the array of resistive memory cells comprises an array of multilevel resistive memory cells.

13. The memory of claim 7, wherein the array of resistive memory cells comprises an array of phase change memory cells.

14. A memory comprising:
    an array of phase change memory cells; and
    a circuit configured to refresh only memory cells in a non-crystalline state in response to a request for a refresh operation.

15. The memory of claim 14, wherein the circuit is configured to refresh at least two memory cells in parallel.

16. The memory of claim 14, wherein the circuit is configured to consecutively reset at least two memory cells within a set operation time.

17. The memory of claim 14, wherein the array of phase change memory cells comprises an array of single bit phase change memory cells.

18. The memory of claim 14, wherein the array of phase change memory cells comprises an array of multi-bit phase change memory cells.

* * * * *